United States Patent
Koo et al.

(10) Patent No.: US 9,331,604 B2
(45) Date of Patent: May 3, 2016

(54) PIEZOELECTRIC DRIVING CIRCUIT AND PIEZOELECTRIC DRIVING METHOD

(71) Applicant: FAIRCHILD KOREA SEMICONDUCTOR LTD., Bucheon (KR)

(72) Inventors: Gwanbon Koo, Bucheon-si (KR); Youngsik Lee, Seoul (KR); Youngbae Park, Anyang (KR)

(73) Assignee: Fairchild Korea Semiconductor LTD (KR)

( * ) Notice: Subject to any disclaimer, the term of this patent is extended or adjusted under 35 U.S.C. 154(b) by 405 days.

(21) Appl. No.: 13/962,485

(22) Filed: Aug. 8, 2013

(65) Prior Publication Data
US 2014/0042935 A1   Feb. 13, 2014

(30) Foreign Application Priority Data
Aug. 13, 2012 (KR) .................... 10-2012-0088640

(51) Int. Cl.
*H01L 41/08* (2006.01)
*H02N 2/00* (2006.01)
*H01L 41/04* (2006.01)

(52) U.S. Cl.
CPC .............. *H02N 2/008* (2013.01); *H01L 41/042* (2013.01)

(58) Field of Classification Search
CPC .............................. H01L 41/042; H02N 2/008
USPC .......................... 318/116; 310/314, 316, 317
IPC .......................... H02N 2/00, 2/008; H03K 4/00
See application file for complete search history.

(56) References Cited

U.S. PATENT DOCUMENTS

| 7,705,516 B2 * | 4/2010 | Yoshida et al. | 310/316.03 |
| 8,139,381 B2 * | 3/2012 | Moon et al. | 363/21.16 |
| 2011/0309803 A1 * | 12/2011 | Fitzi et al. | 310/314 |

* cited by examiner

*Primary Examiner* — Thomas Dougherty
*Assistant Examiner* — Karen B Addison
(74) *Attorney, Agent, or Firm* — Grossman Tucker Perreault & Pfleger PLLC

(57) ABSTRACT

A piezoelectric driving circuit and a driving method thereof are provided. The piezoelectric driving circuit drives a piezoelectric circuit by using a first driving switch connected to one end of a piezoelectric circuit, a second driving switch corresponding to the first driving switch and connected to the other end of the piezoelectric circuit, and a sensing resistor for sensing a current flowing in the piezoelectric circuit. A fire angle and a duty cycle of an upper switch are adjusted such that a peak of a sense voltage generated in the sensing resistor at a timing at which the first driving switch is turned on, in a state in which the second driving switch is turned on.

21 Claims, 8 Drawing Sheets

PIEZOELECTRIC DRIVING CIRCUIT AND PIEZOELECTRIC DRIVING METHOD

CROSS-REFERENCE TO RELATED APPLICATION

This application claims priority to and the benefit of Korean Patent Application No. 10-2012-0088640 filed in the Korean Intellectual Property Office on Aug. 13, 2012, the entire contents of which are incorporated herein by reference.

BACKGROUND OF THE INVENTION (a) Field of the Invention

The present invention relates to a piezoelectric driving circuit for driving a piezoelectric circuit and a method for driving a piezoelectric circuit.

(b) Description of the Related Art

A piezoelectric circuit may convert electrical energy into mechanical energy or mechanical energy into electrical energy. In order to drive the piezoelectric circuit, a full-bridge driving circuit is used.

The piezoelectric circuit includes a capacitor, and when switching elements of the full-bridge driving circuit perform a switching operation, a direction of a voltage supplied to the piezoelectric circuit is changed. Whenever the direction of a voltage supplied to the piezoelectric circuit is changed, a peak current charging the capacitor of the piezoelectric circuit is generated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a piezoelectric driving circuit and a piezoelectric driving method having advantages of reducing a peak current.

An exemplary embodiment of the present invention provides a piezoelectric driving method using a first driving switch connected to one end of a piezoelectric circuit, a second driving switch corresponding to the first driving switch and connected to the other end of the piezoelectric circuit, and a sensing resistor for sensing a current flowing in the piezoelectric circuit.

The piezoelectric driving method may include: turning on the first driving switch in a state in which the second driving switch is in a turned-on state; and adjusting a fire angle and a duty cycle of the first driving switch such that a peak of a sense voltage generated in the sensing resistor is reduced, at an instant at which the first driving switch is turned on.

The adjusting of a fire angle and a duty cycle may include: setting a fire angle and a duty cycle at the time when the peak of the sense voltage is reduced to be smaller than a predetermined reference voltage at the instant at which the first driving switch is turned on, as a fire angle and a duty cycle of the first driving switch, wherein the predetermined reference voltage may be determined according to a peak of an allowable piezoelectric circuit current.

The adjusting of a fire angle and a duty cycle may include: an operation B in which when the peak of the sense voltage at the turn-on instant of the first driving switch is equal to or higher than the reference voltage and a currently held voltage as a peak of the sense voltage at the turn-on instant is equal to or higher than an immediately previous held voltage as a peak of the sense voltage at an immediately previous turn-on instant of the first driving switch, a fire angle at the turn-on timing is reduced and the duty cycle is increased.

The adjusting of a fire angle and a duty cycle may include: storing the currently held voltage as the immediately previous held voltage and comparing the currently held voltage at the turn-on instant of the first driving switch according to the reduced fire angle and the increased duty cycle, with the reference voltage.

The adjusting of a fire angle and a duty cycle may further include: an operation C in which when the currently held voltage is equal to or higher than the reference voltage and lower than the immediately previous held voltage according to the comparison results, the currently held voltage is stored as the immediately previous held voltage and the fire angle is increased.

The adjusting of a fire angle and a duty cycle may include: repeatedly performing the operation B or the operation C according to the results obtained by comparing the currently held voltage and the immediately previous held voltage, when the currently held voltage at the turn-on instant of the first driving switch is equal to or higher than the reference voltage according to the increased fire angle.

The adjusting of a fire angle and a duty cycle may further include: an operation D in which when the currently held voltage is equal to or higher than the reference voltage and equal to or higher than the immediately previous voltage according to the comparison results, the duty cycle is increased, the currently held voltage is stored as the immediately previous held voltage, and the currently held voltage at the turn-on instant of the first driving switch according to the increased duty cycle is compared with the reference voltage.

In the adjusting of a fire angle and a duty cycle, when the currently held voltage is equal to or higher than the reference voltage and equal to or higher than the immediately previous held voltage in the operation D, the operation D may be repeatedly performed.

The adjusting of a fire angle and a duty cycle may further include: when the currently held voltage is equal to or higher than the reference voltage and lower than the immediately previous held voltage, storing the currently held voltage as the immediately previous held voltage, and reducing the fire angle.

The adjusting of a fire angle and a duty cycle may further include: detecting and holding a peak of the sense voltage at the turn-on instant of the first driving switch according to the reduced fire angle, to generate a currently held voltage; comparing the currently held voltage with the reference voltage; and when the currently held voltage is equal to or higher than the reference voltage, comparing the currently held voltage with the immediately previous held voltage.

In the adjusting of a fire angle and a duty cycle, when the currently held voltage is equal to or higher than the reference voltage and lower than the immediately previous held voltage, the fire angle may be reduced again and the foregoing operations may be repeatedly performed.

The adjusting of a fire angle and a duty cycle may further include: when the currently held voltage is equal to or higher than the reference voltage and is equal to or higher than the immediately previous held voltage, increasing the fire angle and the duty cycle and storing the currently held voltage as the immediately previous held voltage.

The adjusting of a fire angle and a duty cycle may further include: when the currently held voltage at the turn-on instant of the first driving switch according to the increased fire angle and the increased duty cycle is equal to or higher than the reference voltage, comparing the currently held voltage and the immediately previous held voltage.

The adjusting of a fire angle and a duty cycle may further include: an operation E in which when the currently held voltage is lower than the immediately previous held voltage, the currently held voltage is stored as the immediately previous held voltage and the fire angle is increased.

The adjusting of a fire angle and a duty cycle may further include: an operation F in which when the currently held voltage is equal to or higher than the immediately previous held voltage, the duty cycle is increased again and the currently held voltage is stored as the immediately previous held voltage. In the adjusting of a fire angle and a duty cycle, when the currently held voltage at the turn-on instant of the first driving switch according to the increased duty cycle is equal to or higher than the reference voltage, the currently held voltage and the immediately previous held voltage may be compared and the operation E or the operation F may be repeatedly performed according to the comparison results.

A piezoelectric driving circuit according to an embodiment of the present invention drives a piezoelectric circuit connected between a first node and a second node. The piezoelectric driving circuit may include: a full-bridge circuit including a first switch and a third switch connected to the first node and a second switch and a fourth switch connected to the second node; and a sensing resistor connected between the full-bridge circuit and a predetermined voltage in order to sense a current flowing to the piezoelectric circuit.

The piezoelectric driving circuit may be operated according to an operation in which a first driving switch is turned on in a state in which a second driving switch is turned on; and an operation in which a fire angle and a duty cycle of the first driving switch are adjusted such that a peak of a sense voltage generated in the sensing resistor is reduced at a turn-on instant of the first driving switch.

Any one of the first switch and the second switch of the piezoelectric driving circuit may be the first driving switch, and any one of the third switch and the fourth switch may be the second driving switch. When the first switch is the first driving switch, the fourth switch may be the second driving switch. When the second switch is the first driving switch, the third switch may be the second driving switch. The piezoelectric circuit may further include an external inductor connected between the first node and the second node.

According to embodiments of the present invention, the piezoelectric driving circuit and the piezoelectric driving method capable of reducing a peak current are provided.

DETAILED DESCRIPTION OF THE EMBODIMENTS

Figure 1:
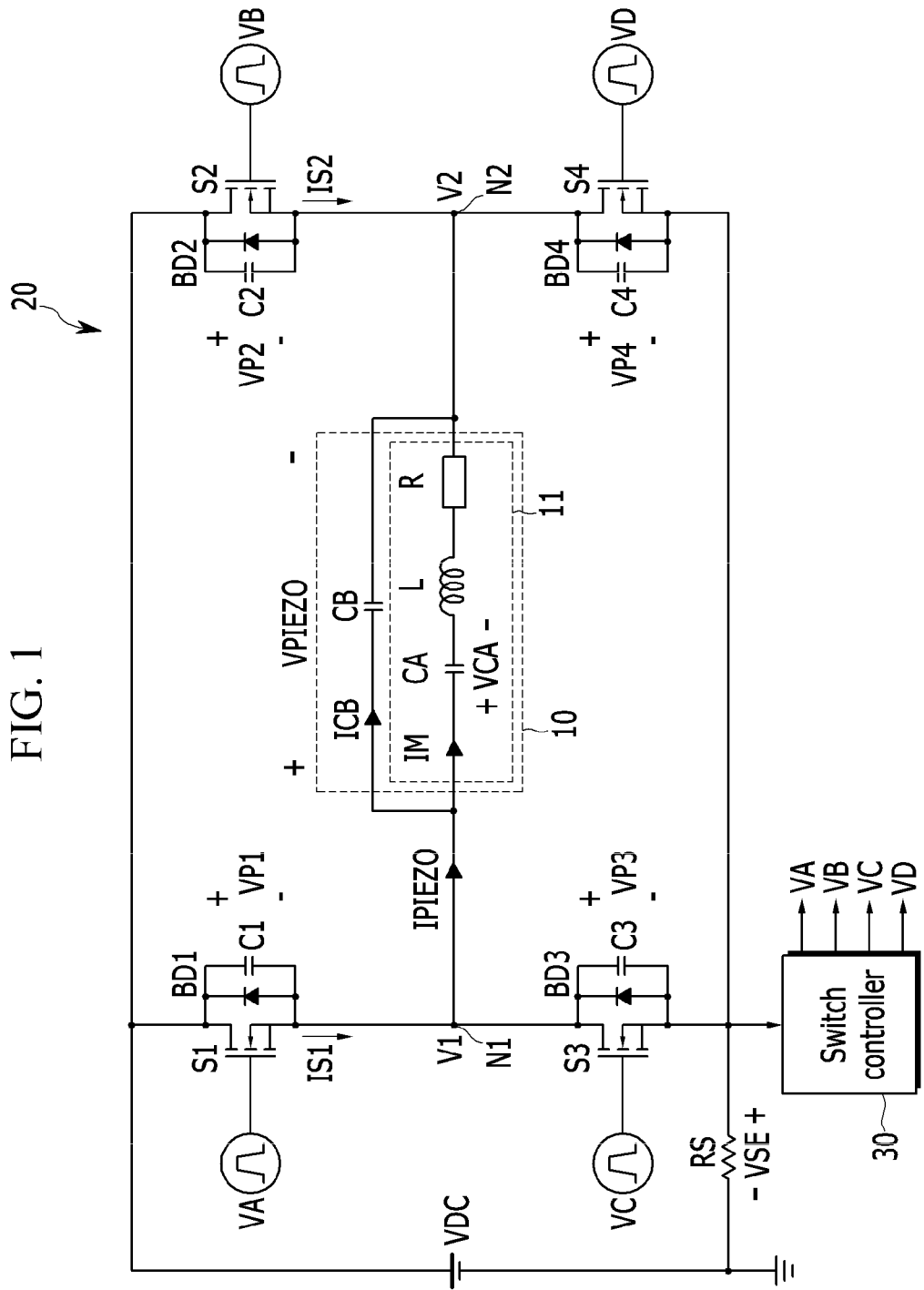
FIG. 1 is a view illustrating a piezoelectric driving circuit according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a piezoelectric driving circuit and a piezoelectric driving method according to an embodiment of the present invention will be described with reference to the accompanying drawings. A peak current is reduced as switching of switches of a piezoelectric driving circuit is close to zero voltage switching (ZVS). In a description of an embodiment of the present invention, a switching operation close to ZVS will be referred to as quasi-ZVS (QZVS). QZVS refers to improved ZVS in comparison to the conventional half-ZVS and partial ZVS.

FIG. 1 is a view illustrating a piezoelectric electric circuit according to an embodiment of the present invention.

A piezoelectric circuit 10 connected to the piezoelectric driving circuit 20 is a general piezoelectric circuit which includes a series resonance circuit 11 including a first inductor L, a first capacitor CA, and a resistor R, and a second capacitor CB.

The piezoelectric circuit 10 illustrated as an equivalent circuit in FIG. 1 is merely an example. Namely, the piezoelectric driving circuit 20 according to an embodiment of the present invention is not limited to the piezoelectric circuit 10 illustrated in FIG. 1 and may be applied to a piezoelectric circuit implemented as a different equivalent circuit.

The piezoelectric driving circuit 20 is implemented as a full-bridge circuit including four driving switches S1 to S4. Body diodes BD1 to BD4 and parasitic capacitors C1 to C4 are connected in parallel between both electrodes of the four driving switches S1 to S4, respectively. The piezoelectric driving circuit 20 is connected to a direct current (DC) voltage (VDC) and a ground.

Hereinafter, the four driving switches S1 to S4 will be referred to as first to fourth switches S1 to S4, respectively. Among the first to fourth switches S1 to S4, a switch connected to the VDC will be referred to as an upper switch, and a switch connected to the ground will be referred to as a lower switch. For example, the first and second switches S1 and S2 are upper switches, and the third and fourth switches are lower switches.

The first to fourth switches S1 to S4 according to an embodiment of the present invention are implemented as n-channel type MOSFETs. A first electrode of each of the first to fourth switches S1 to S4 is a drain electrode, a second electrode thereof is a source electrode, and a control electrode thereof is a gate electrode.

However, the first to fourth switches according to an embodiment of the present invention are not limited to MOSFETs and may also be implemented as BJTs or IGBTs, instead of MOSFETs.

One end of the piezoelectric circuit 10 is connected to a node N1 between a source electrode of the first switch S1 and a drain electrode of the third switch S3, and the other end of the piezoelectric circuit 10 is connected to a node N2 between a source electrode of the second switch S2 and a drain electrode of the fourth switch S4.

In the piezoelectric circuit 10, the first capacitor CA, the first inductor L, and the resistor R are connected in series between the node N1 and the node N2. The first capacitor CA, the first inductor L, and the resistor R connected in series constitute a series resonance circuit. The second capacitor CB is connected between the node N1 and the node N2, and is connected in parallel to the series resonance circuit.

A current IM is a current flowing to the series resonance circuit, a current ICB is a current flowing to the second capacitor CB, and a piezoelectric current IPIEZO is a current flowing to the piezoelectric circuit 10, which is the sum of the current IM and the current ICB.

In detail, one end of the first capacitor CA is connected to the node N1. One end of the first inductor L is connected to the other end of the first capacitor CA. One end of the resistor R is connected to the other end of the first inductor L, and the other end of the resistor R is connected to the node N2.

Drain electrodes of the first switch S1 and the second switch S2 are connected to the voltage VDC, and source electrodes of the third switch S3 and the fourth switch S4 are connected to the ground.

A first control voltage VA is supplied to a gate electrode of the first switch S1, and a second control voltage VB is supplied to a gate electrode of the second switch S2. A third control voltage VC is supplied to a gate electrode of the third switch S3, and a forth control voltage VD is supplied to a gate electrode of the fourth switch S4.

Both-end voltages of the first switch to fourth switch S1 to S4 are called first to fourth switch voltages VP1 to VP4.

In order to sense a piezoelectric current, a sensing resistor RS may be connected between the piezoelectric driving circuit 20 and the DC voltage VDC or may be connected between the piezoelectric driving circuit 20 and the ground. For example, as illustrated in FIG. 1, the sensing resistor RS is connected between the source electrodes of the third switch S3 and the fourth switch S4 and the ground, and the piezoelectric current IPIEZO flows to the ground through the sensing resistor RS.

A sense voltage VSE generated by a current flowing in the sensing resistor RS is used to determine a fire angle and a duty cycle of the first and second switches S1 and S2 positioned in the upper side.

The fire angle refer to a degree of shifting of a turn-on instant of the upper switch S1 or S2 from a turn-on instant of the lower switch S4 or S3. For example, a fire angle refers to a degree of shifting of a turn-on start instant of the first switch S1 (or the second switch S2) from a turn-on start instant of the fourth switch S4 (or the third switch S3). A duty cycle refers to a turned-on time, during a switching period, in which the first and second switches S1 and S2 are turned on.

For example, a difference between T3 as a turn-on instant of the fourth switch S4 and T4 as a turn-on instant of the first switch S1 or a difference between T6 as a turn-on instant of the third switch S3 and T7 as a turn-on instant of the second switch S2 corresponds to a fire angle.

According to how close it is to ZVS, peak currents at an instant at which the first and second switches S1 and S2, the upper switches, are turned on are changed. As being far from ZVS, a both-end voltage of a corresponding switch is high when turned on, so a peak current is the smallest in case of ZVS and the peak current is increased as being far from ZVS.

A peak current of a switch is reflected in a peak of the piezoelectric current IPIEZO. Then, the sense voltage VSE also has a peak voltage according to the peak of the piezoelectric current IPIEZO. In an embodiment of the present invention, upon sensing it, a fire angle and a duty cycle of the first and second switches S1 and S2 are adjusted toward a reduction of a peak voltage.

In detail, a switch controller 30 illustrated in FIG. 1 receives the sense voltage VSE and adjusts at least one of the fire angle and the duty cycle such that a peak value of the sense voltage VSE is reduced.

According to the increase or reduction in the fire angle, a peak of the piezoelectric current IPIEZO may also be reduced or increased. For example, when the both-end voltage VP1 of the first switch S1 is reduced by a sine wave after the fourth switch is turned on, the first switch S1 should be turned at the lowest voltage to minimize a peak current (QZVS close to ZVS). The switch controller 30 may adjust a fire angle such that corresponding switch is turned on at the lowest point of the both-end voltage of the switch reduced by a sine wave.

In addition, as the duty cycle is increased, energy stored in the inductor L is increased. After the switch is turned off, sufficient energy is required to discharge parasitic capacitor and the capacitor CB. Thus, as the duty cycle is increased, it is advantageous for ZVS.

For example, as energy stored in the inductor L is reduced, less energy is used for discharge parasitic capacitor and the capacitor CB. Then, a difference between the lowermost point of the voltage VP1 reduced according to the sine wave and a zero voltage is increased. Thus, when the first switch S1 is turned on, a peak current is increased.

In an embodiment of the present invention, the switch controller 30 adjusts a duty cycle to control the lowest point of the both-end voltage of the switch reduced by a sine wave such that it is the lowermost within an allowable range, and adjusts a fire angle such that the switch is turned on at the lowest point.

Hereinafter, an operation of the piezoelectric driving circuit 20 will be described with reference to FIG. 2.

Figure 2:
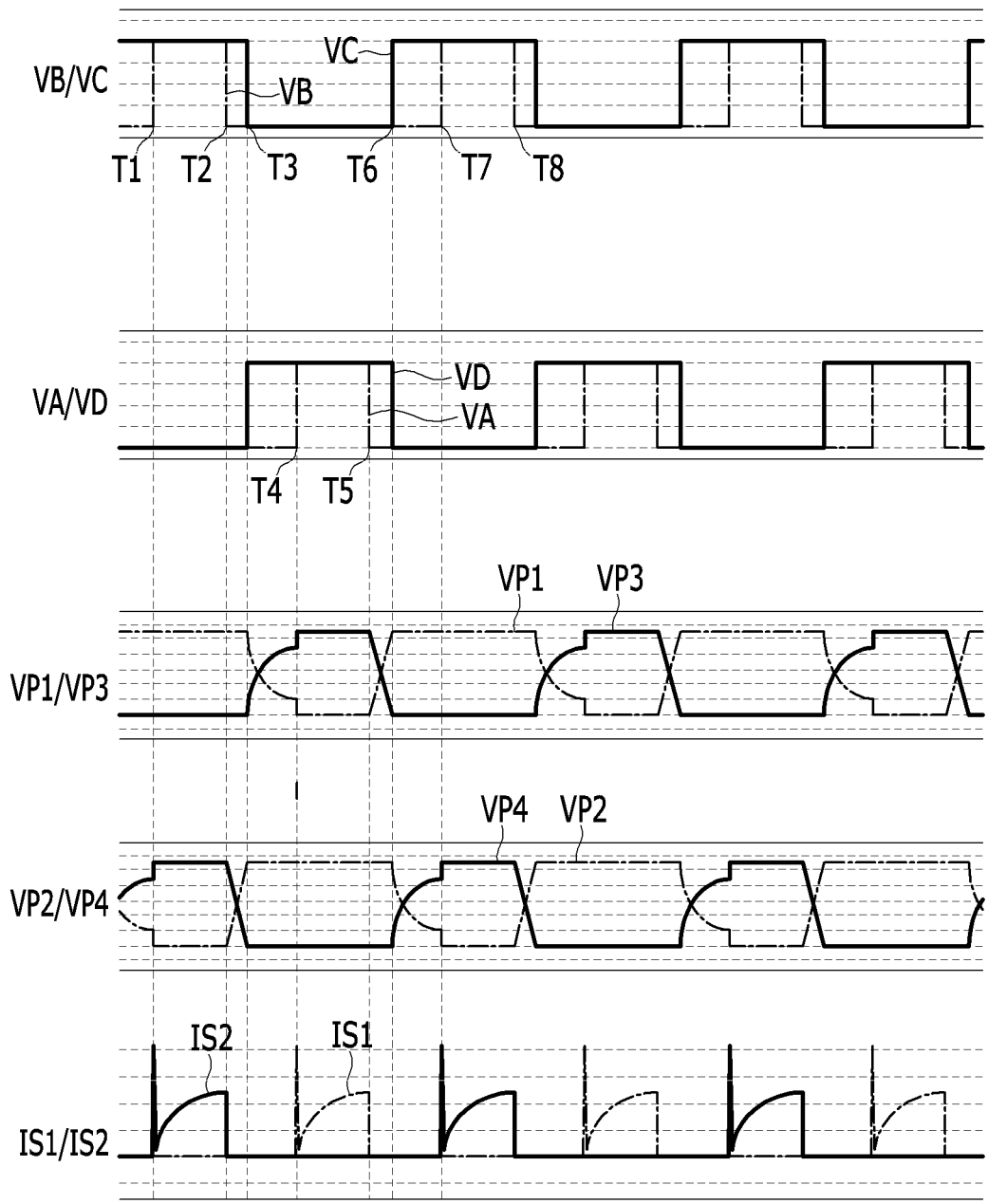
FIG. 2 is a waveform view illustrating a control voltage of the piezoelectric driving circuit, switch currents, and both-end voltage of switches according to an embodiment of the present invention.

FIG. 2 is a waveform view illustrating a control voltage of the piezoelectric driving circuit, switch currents, and both end voltages of switches according to an embodiment of the present invention.

A sine wave of the voltage VP2 is the lowest at T1, and a second control voltage VB has a high level at T1 according to a fire angle of the second switch S2 set according to T1, to turn on the second switch S2 (QZVS). As the second switch S2 is turned on, a fourth switch voltage VP4, which has been increased, has the same level as that of the voltage VDC at T1.

At T2 at which a pre-set duty cycle has lapsed, the second control voltage VB has a low level and the second switch S2 is turned off.

At T1, a third control voltage VC has a high level and the third switch S3 is in an ON state, so the voltage VDC is connected to the piezoelectric circuit 10 during the period T1 to T2, and a peak is generated in a second switch current IS2 at T1. During the period T1 to T2, the second switch current IS2 is increased. During the period T1 to T2, the first switch S1 and the fourth switch S4 are in an OFF state, so the first switch voltage VP1 and the fourth switch voltage VP4 are equal to the voltage VDC, and the second switch S2 and the third switch S3 are in an ON state, so the second switch voltage VP2 and the third switch voltage VP3 are equal to a zero voltage.

After the second switch S2 is turned off at T2, a capacitor C4 is discharged by the inductor current IM to reduce the fourth switch voltage VP4. At a timing at which the fourth switching voltage VP4, which has been reduced starting from T2, reaches a zero voltage, or at a slightly later T3, the fourth control voltage VD has a high level and the fourth switch S4 is turned on.

At T3, the third control voltage VC has a low level and the third switch S3 is turned off. In actuality, the third control voltage VC has a low level before a predetermined dead time starting from T3, to turn off the third switch S3.

From a timing at which the third switch S3 is turned off, the capacitor C1 starts to be discharged and the capacitor C3 is charged, so the first switch voltage VP1 starts to be reduced from T3 and the third switch voltage VP3 starts to be increased.

The first switch voltage VP1, which has been reduced by a sine wave, reaches the lowest voltage (in the sine wave) at T4. The first control voltage VA has a high level at T4 according to a fire angle of the first switch S1 set according to T4, to turn on the switch S1 (QZVS). And then, at T5 at which the pre-set duty cycle has lapsed, the first control voltage VA has a low level and the first switch S1 is turned off.

As the first switch S1 is turned on, the third switch voltage VP3, which has been increased, has the same level as that of the voltage VDC at T4.

Since the fourth switch S4 is in an ON state at T4, the voltage VDC is connected to the piezoelectric circuit 10 during the period T4 to T5, and a peak is generated in the first switch current IS1 at T4.

At T5, the first control voltage VA has a low level and the first switch S1 is turned off. During a period T4 to T5, the first switch current IS1 is increased. During the period T4 to T5, the second switch S2 and the third switch S3 are in an OFF state, so the second switch voltage VP2 and the third switch voltage VP3 are equal to the voltage VDC, and the first switch S1 and the fourth switch S4 are in an ON state, so the first switch voltage VP1 and the fourth switch voltage VP4 are zero voltages.

After T5, the capacitor C3 is discharged to reduce the third switch voltage VP3. At a timing at which the third switch voltage VP3, which has been reduced, reaches a zero voltage or at a slightly later T6, the third switch S3 is turned on. The capacitor C1 is starts to be charged from T5 to increase the first switch voltage VP1.

At T6, the third switch voltage VP3 is reduced to a zero voltage, so at T6, the third control voltage VC has a high level and the third switch S3 is turned on.

At T6, the fourth control voltage VD has a low level and the fourth switch S4 is turned off. In actuality, the fourth control voltage VD has a low level before a predetermined dead time starting from T6, to turn off the fourth switch S4.

At T6, the capacitor C2 starts to be discharged to reduce the second switch voltage VP2, and the capacitor C4 starts to be charged to increase the fourth switch voltage VP4.

The second switch voltage VP2, which has been reduced by a sine wave, reaches the lowest voltage (in the sine wave) at T7. Then, the second control voltage VB has a high level to turn on the second switch S2 (QZVS). As the second switch S2 is turned on, the fourth switch voltage VP4, which has been increased, has the same level as that of the voltage VDC at T7.

Thereafter, the operations from T1 to T7 are repeatedly performed, so a detailed description thereof will be omitted.

In FIG. 2, the period T3 to T4 is a fire angle of the first switch S1, and as the fire angle is reduced, T4 is close to T3, and as the fire angle is increased, T4 becomes distant from T3. The period T4 to T5 is determined according to a duty cycle of the first switch S1.

Similarly, the period T6 to T7 is a fire angle of the second switch S2, and as the fire angle is reduced, T7 is close to T6, and as the fire angle is increased, T7 becomes distant from T6. The period T7 to T8 is determined according to a duty cycle of the second switch S2.

Hereinafter, a method for adjusting a fire angle and a duty cycle according to an embodiment of the present invention will be described with reference to FIG. 3.

Figure 3:
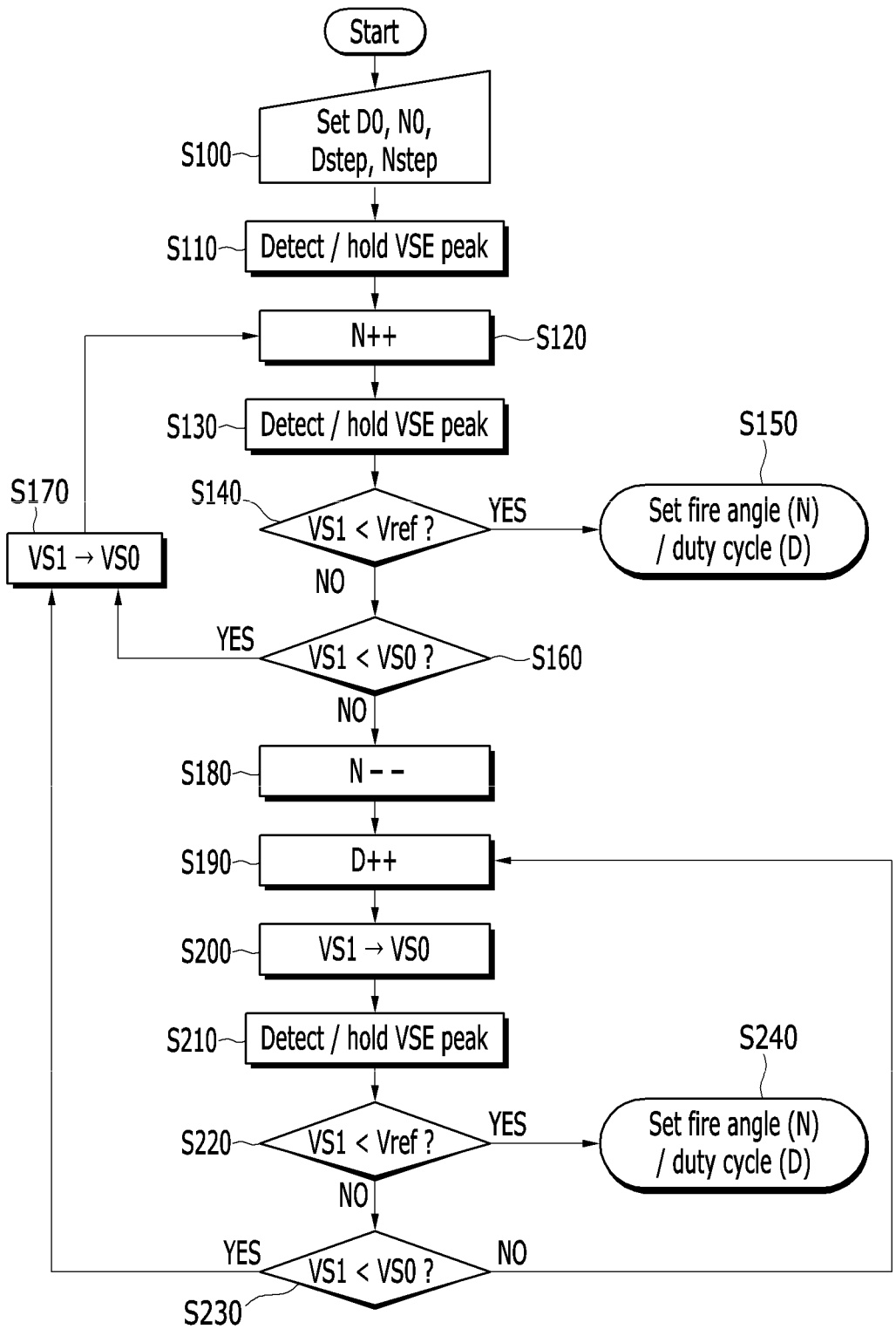
FIG. 3 is a flow chart illustrating a method for adjusting a fire angle and a duty cycle according to an embodiment of the present invention.

FIG. 3 is a flow chart illustrating a method for adjusting a fire angle and a duty cycle according to an embodiment of the present invention.

First, an initial duty cycle D0, an initial fire angle N0, a unit duty cycle Dstep and a unit fire angle Nstep are set (S100).

A peak current is detected by using the sense voltage VSE and held (S110). Here, the held voltage is called an immediately previous held voltage VS0.

The fire angle N is increased by the unit fire angle Nstep (S120). After step S120, a peak of the sense voltage VSE generated according to the increased fire angle N is detected and held (S130) to generate a currently held voltage VS1.

The currently held voltage VS1 is compared with a reference voltage Vref to check whether it is lower than the reference voltage Vref in step S140. The reference voltage Vref may be changed according to a design, and is determined according to an allowable peak current. As illustrated in FIG. 2, it is set such that a peak current generated under the conditions that the first switch and the second switch S1 and S2 are quasi-zero-voltage-switched (QZVS) and the third and fourth switches S3 and S4 are zero-voltage-switched (ZVS). Here, QZVS refers to a switching operation in which a switch is turned on at the lowest voltage when a both-end voltage of the switch is reduced by a sine wave.

When the currently held voltage VS1 is lower than the reference voltage Vref in step S140, a peak current of the piezoelectric driving circuit is allowable, so a switching operation may be controlled by the corresponding fire angle and duty cycle. The fire angle N and the duty cycle D when the currently held voltage VS1 is lower than the reference voltage Vref are set as a fire angle and a duty cycle of the upper switch (S1 or S2) (S150). When the fire angle N and the duty cycle D are set, the operation of adjusting the fire angle N and the duty cycle D is terminated.

When the currently held voltage VS1 is equal to or higher than the reference voltage Vref in step S140, the currently held voltage VS1 and the immediately previous held voltage VS0 are compared (S160).

When the currently held voltage VS1 is lower than the immediately previous held voltage VS0 according to the comparison result in step S160, the currently held voltage VS1 is stored as the immediately previous held voltage VS0 (S170). And then, the process is moved to step S120 of increasing the fire angle N.

When the currently held voltage VS1 is equal to or higher than the immediately previous voltage VS0 according to the comparison results in step S160, the fire angle N increased in step S120 is reduced (S180). Here, a degree of reducing the fire angle N follows the unit fire angle Nstep.

And then, the duty cycle D is increased by the unit duty cycle Dstep (S190). And then, the currently held voltage VS1 is stored as the immediately previous held voltage VS0 (S200). A peak of the sense voltage VSE generated according to the increased duty cycle D is detected and held (S210) to generate a currently held voltage VS1. The currently held voltage VS1 is compared with the reference voltage Vref to check whether it is lower than the reference voltage Vref in step S220.

When the currently held voltage VS1 is lower than the reference voltage Vref in step S220, the corresponding fire angle N and duty cycle D are set (S240). When the currently held voltage VS1 is equal to or higher than the reference voltage Vref in step S220, the currently held voltage VS1 and the immediately previous held voltage VS0 are compared (S230).

When the currently held voltage VS1 is lower than the immediately previous held voltage VS0 according to the comparison result in step S230, the currently held voltage VS1 is stored as the immediately previous held voltage VS0 (S170). And then, the process is moved to step S120 of increasing the fire angle N.

When the currently held voltage VS1 is equal to or higher than the immediately previous voltage VS0 according to the comparison results in step S230, the process is moved to step S190 of increasing the duty cycle N.

When the fire angle N and the duty cycle D are adjusted according to an embodiment of the present invention, a fire angle N and a duty cycle D when the peak of the sense voltage VSE is reduced to be lower than the reference voltage Vref are set.

Hereinafter, a method for adjusting a fire angle N and a duty cycle D according to the flow chart of FIG. 3 according to an embodiment of the present invention will be described with reference to FIG. 4.

Figure 4:
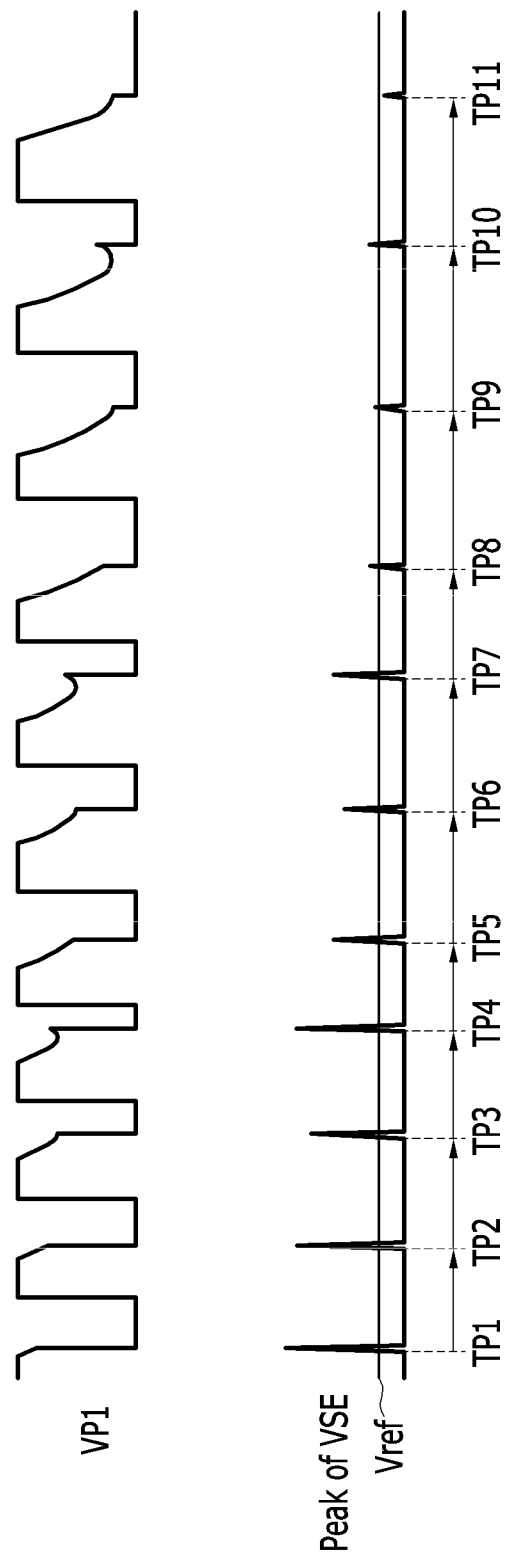
FIG. 4 is a waveform view illustrating peaks of sense voltages and both-end voltages of upper switches according to an embodiment of the present invention.

FIG. 4 is a waveform view illustrating peaks of a sense voltage and both end voltages of an upper switch according to an embodiment of the present invention. For example, the voltage VP1 of the first switch S1 is illustrated in FIG. 4. The peak voltage of the sense voltage VSE illustrated in FIG. 4 is a voltage following a peak present in a waveform of the piezoelectric current IPIEZO that follows a sine wave.

First, the first switch S1 is turned on at TP1 according to an initial fire angle N0 and an initial duty cycle D0. Here, the voltage VP1 is a very high voltage relative to a zero voltage, so a peak of the sense voltage VSE is also very high. A peak of the sense voltage VSE at TP1 is detected and held to become the immediately previous held voltage VS0 (S110).

After the fire angle N is increased by the unit fire angle Nstep (S120), a peak of the sense voltage VSE is detected at TP2 and held, and a peak of the sense voltage VSE at TP2 is the currently held voltage VS1 (S130). Since the currently held voltage VS1 is higher than the reference voltage Vref (S140), it is compared with the immediately previous held voltage VS0 (S160). Since the currently held voltage VS1 is smaller than the immediately previous held voltage VS0, the currently held voltage VS1 is stored as the immediately previous held voltage VS0 (S170), and the fire angle N is increased again by the unit fire angle Nstep (S120).

Since a peak of the sense voltage VSE at TP3 is the currently held voltage VS1 (S130) and is higher than the reference voltage Vref (S140), it is compared with the immediately previous held voltage VS0 (S160). Since the currently held voltage VS1 is lower than the immediately previous held voltage VS0, the currently held voltage VS1 is stored as the immediately previous voltage VS0 (S170) and the fire angle N is increased again by the unit fire angle Nstep (S120).

Since a peak of the sense voltage VSE at TP4 is the currently held voltage VS1 (S130) and is higher than the reference voltage Vref (S140), it is compared with the immediately previous held voltage VS0 (S160). Since the currently held voltage VS1 is higher than the immediately previous held voltage VS0, the fire angle N is reduced by the unit fire angle Nstep (S180). The duty cycle D is increased by the unit duty cycle Dstep (S190) and the currently held voltage VS1 is stored as the immediately previous held voltage VS0.

Since a peak of the sense voltage VSE at TP5 becomes the currently held voltage VS1 (S210) and is higher than the reference voltage Vref (S220), it is compared with the immediately previous held voltage VS0 (S230). Since the currently held voltage VS1 is lower than the immediately previous held voltage VS0, the currently held voltage VS1 is stored as the immediately previous held voltage VS0 (S170). And then, the fire angle N is increased again by the unit fire angle Nstep (S120).

Since a peak of the sense voltage VSE at TP6 becomes the currently held voltage VS1 (S130) and is higher than the reference voltage Vref (S140), it is compared with the immediately previous held voltage VS0 (S160). Since the currently held voltage VS1 is lower than the immediately previous held voltage VS0, the currently held voltage VS1 is stored as the immediately previous held voltage VS0 (S170), and the fire angle N is increased again by the unit fire angle Nstep (S120).

Since a peak of the sense voltage VSE at TP7 becomes the currently held voltage VS1 (S130) and is higher than the reference voltage Vref (S140), it is compared with the immediately previous held voltage VS0 (S160). Since the currently held voltage VS1 is higher than the immediately previous held voltage VS0, the fire angle N is reduced by the unit fire angle Nstep (S180). The duty cycle D is increased by the unit duty cycle Dstep (S190), and the currently held voltage VS1 is stored as the immediately previous held voltage VS0.

Since a peak of the sense voltage VSE at TP8 becomes the currently held voltage VS1 (S210) and is higher than the reference voltage Vref (S220), it is compared with the immediately previous held voltage VS0 (S230). Since the currently held voltage VS1 is lower than the immediately previous held voltage VS0, the currently held voltage VS1 is stored as the immediately previous held voltage VS0 (S170). And then, the fire angle N is increased again by the unit fire angle Nstep (S120).

Since a peak of the sense voltage VSE at TP9 becomes the currently held voltage VS1 (S130) and is higher than the reference voltage Vref (S140), it is compared with the immediately previous held voltage VS0 (S160). Since the currently held voltage VS1 is lower than the immediately previous held voltage VS0, the currently held voltage VS1 is stored as the immediately previous held voltage VS0 (S170), and the fire angle N is increased again by the unit fire angle Nstep (S120).

Since a peak of the sense voltage VSE at TP10 becomes the currently held voltage VS1 (S130) and is higher than the reference voltage Vref (S140), it is compared with the immediately previous held voltage VS0 (S160). Since the currently held voltage VS1 is higher than the immediately previous held voltage VS0, the fire angle N is reduced by the unit fire angle Nstep (S180). The duty cycle D is increased by the unit duty cycle Dstep (S190), and the currently held voltage VS1 is stored as the immediately previous held voltage VS0.

Since a peak of the sense voltage VSE at TP11 becomes the currently held voltage VS1 (S210) and is lower than the reference voltage Vref (S220), a current fire angle N and a current duty cycle D are set (S240).

In this manner, in an embodiment of the present invention, the peak of the sense voltage VSE, i.e., the piezoelectric current IPIEZO, is detected, and the piezoelectric circuit is driven by a fire angle and a duty cycle when the sensed peak current is smaller than a predetermined reference current.

The foregoing content described with reference to FIG. 4 is merely an example and the present invention is not limited thereto. For example, after the duty cycle D is increased (S190), the currently held voltage VS1 is compared with the immediately previous held voltage VS0 (S230), and when the immediately previous held voltage VS0 is lower than the currently held voltage VS1 according to the comparison result, the duty cycle D is increased again (S190).

Also, the method for adjusting the fire angle and the duty cycle is not limited to FIG. 3 and in another embodiment of the present invention, a method different from that of FIG. 3 may be used.

Hereinafter, a method for adjusting a fire angle and a duty cycle according to another embodiment of the present invention will be described with reference to FIGS. 5A and 5B.

Figure 5A:
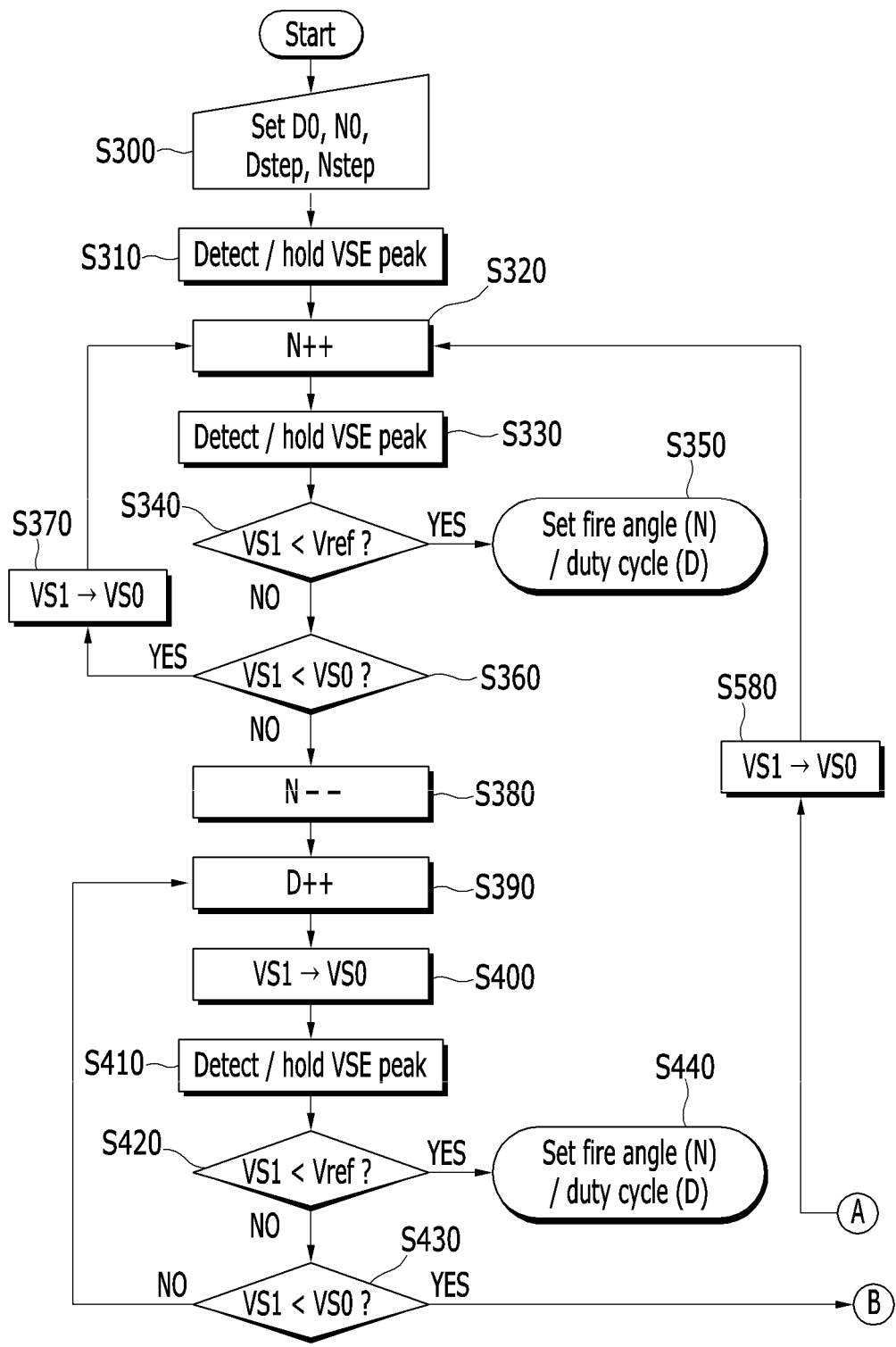
FIG. 5A is a flow chart illustrating one part of a method for adjusting a fire angle and a duty cycle according to another embodiment of the present invention.

FIG. 5A is a flow chart illustrating one part of a method for adjusting a fire angle and a duty cycle according to another embodiment of the present invention.

Figure 5B:
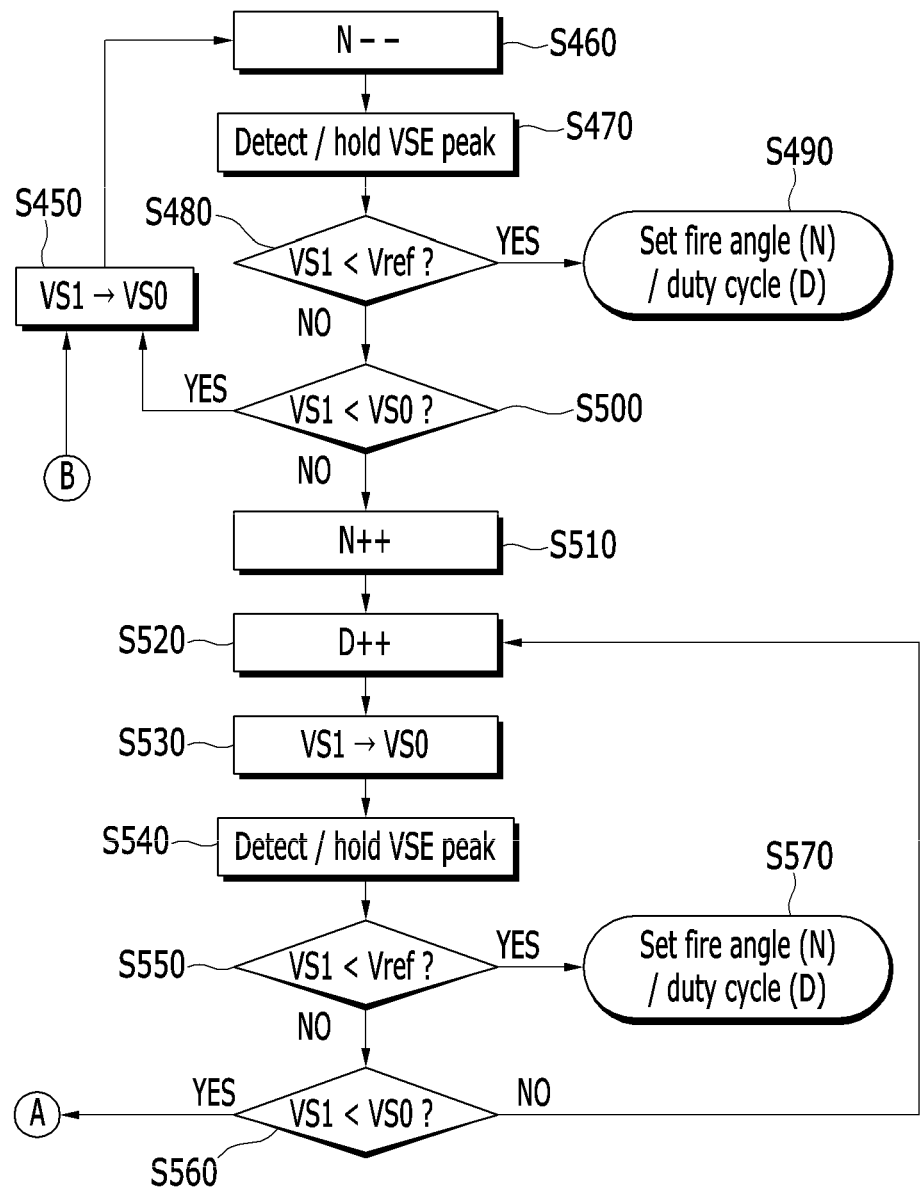
FIG. 5B is a flow chart illustrating another part of the method for adjusting a fire angle and a duty cycle according to another embodiment of the present invention.

FIG. 5B is a flow chart illustrating another part of the method for adjusting a fire angle and a duty cycle according to another embodiment of the present invention.

Compared with the foregoing embodiment illustrated in FIG. 3, steps S310 to S450 are the same. Differences between the two embodiments are as follows.

Namely, when the currently held voltage VS1 after the duty cycle D is increased by the unit duty cycle Dstep is lower than the immediately previous held voltage VS0, in the foregoing embodiment, the currently held voltage VS1 is stored as the immediately previous held voltage VS0 and the fire angle N is increased again. In comparison, in another embodiment of the present invention, the fire angle N is reduced.

Subsequently, when the currently held voltage VS1 after the fire angle N is reduced is higher than the immediately previous held voltage VS0, the reduced fire angle N is increased and the duty cycle D is increased. Thereafter, the currently held voltage VS1 becomes the immediately previous held voltage VS0 and a peak of the sense voltage VSE with the increased fire angle N and the increased duty cycle D is set as the currently held voltage VS1 and compared with the reference voltage Vref and the immediately previous held voltage VS0.

In step S460, the fire angle N is reduced. In step S470, a peak of the sense voltage VSE with the reduced fire angle N is detected and held to generate the currently held voltage VS1.

In step S480, the currently held voltage VS1 is compared with the reference voltage Vref to check whether it is lower than the reference voltage Vref. In step S480, when the currently held voltage VS1 is lower than the reference voltage Vref, a corresponding fire angle N and a corresponding duty cycle D are set.

When the currently held voltage VS1 is equal to or higher than the reference voltage Vref in step S480, the currently held voltage VS1 is compared with the immediately previous held voltage VS0 (S500). When the currently held voltage VS1 is lower than the immediately previous held voltage VS0 in step S500, the currently held voltage VS1 is stored as the immediately previous held voltage VS0 (S450). The process is moved to the step S460 of increasing the fire angle N.

When the currently held voltage VS1 is equal to or higher than the immediately previous held voltage VS0 in step S500, the fire angle N is increased (S510) and the duty cycle D is increased (S520). And then, the currently held voltage VS1 is stored as the immediately previous held voltage VS0 (S450). A peak of the sense voltage VSE generated according to the increased fire angle N and the increased duty cycle D is detected and held (S540) to generate the currently held voltage VS1.

The currently held voltage VS1 is compared with the reference voltage Vref to check whether it is lower than the reference voltage Vref in step S550. When the currently held voltage VS1 is lower than the reference voltage Vref in step S550, the corresponding fire angle N and duty cycle D are maintained (S570).

When the currently held voltage VS1 is equal to or higher than the reference voltage Vref in step S550, the currently held voltage VS1 and the immediately previous held voltage VS0 are compared (S560).

When the currently held voltage VS1 is lower than the immediately previous held voltage VS0 according to the comparison result in step S560, the currently held voltage VS1 is stored as the immediately previous held voltage VS0 (S580). And then, the process is moved to step S320 of increasing the fire angle N.

When the currently held voltage VS1 is equal to or higher than the immediately previous voltage VS0 according to the comparison results in step S560, the process is moved to step S520 of increasing the duty cycle N.

So far, the method for adjusting a fire angle and a duty cycle of the upper switches of the piezoelectric driving circuit for driving the piezoelectric circuit 10 has been described, but a fire angle and a duty cycle of the lower switches may also be adjusted. Namely, in a state in which the duty cycle of the upper switches S1 and S2 is fixed as 50%, a fire angle and a duty cycle of the lower switches S3 and S4 are adjusted until when a peak of the sense voltage VSE is reduced to be lower than the reference voltage Vref.

In addition, the present invention may also be applicable to a different piezoelectric circuit, as well as to the piezoelectric circuit 10 illustrated in FIG. 1.

Figure 6:
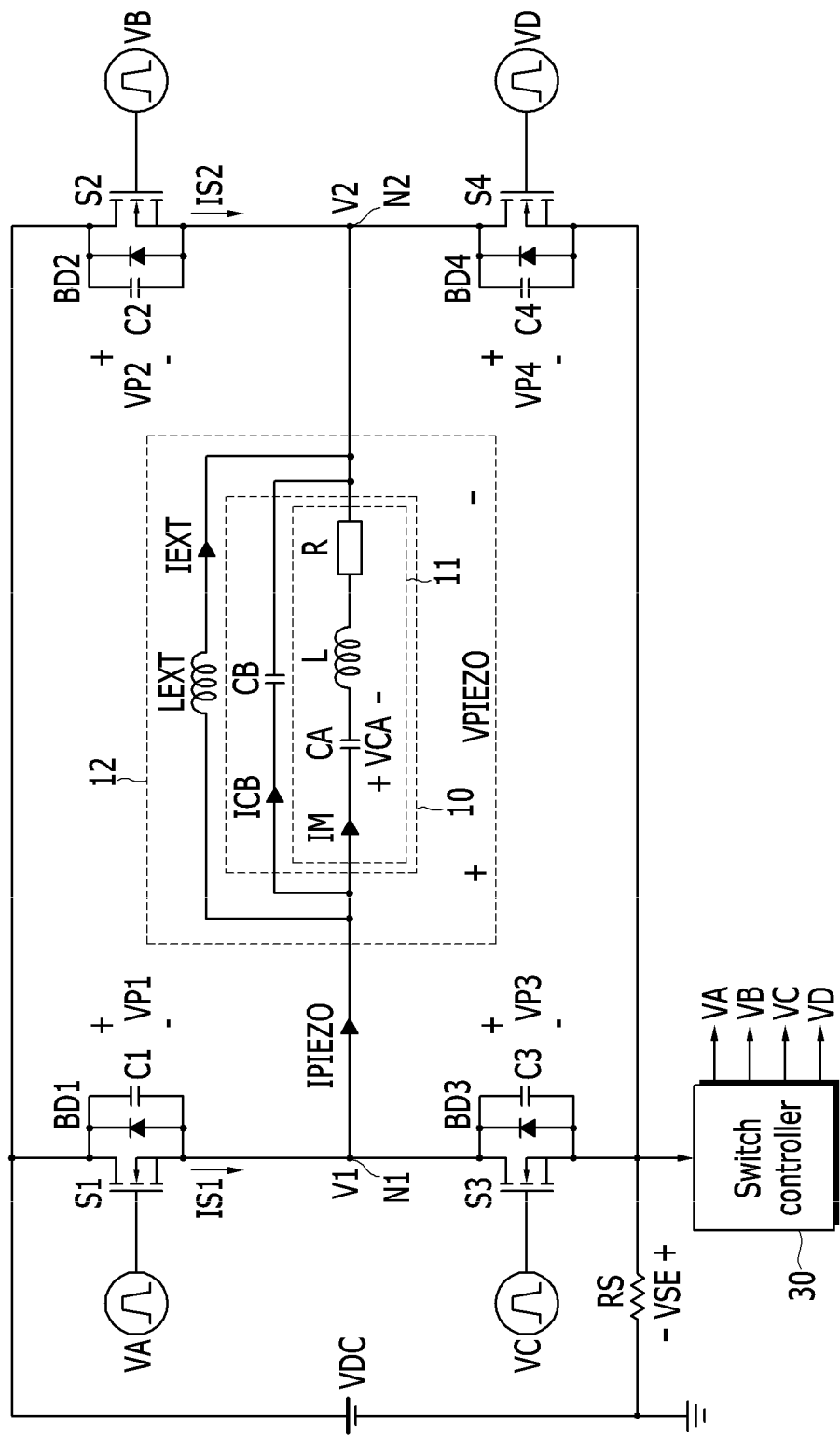
FIG. 6 is a view illustrating a piezoelectric driving circuit applied to a piezoelectric circuit further including an external inductor according to another embodiment of the present invention.

FIG. 6 is a view illustrating a piezoelectric driving circuit applied to a piezoelectric circuit further including an external inductor according to another embodiment of the present invention. The same reference numerals as those of FIG. 1 will be used for the same elements and a detailed description thereof will be omitted.

The piezoelectric circuit 12 further includes an external inductor LEXT. Since the external inductor LEXT is added, energy sufficient for discharging the capacitor CB and parasitic capacitor can be stored. Thus, in this embodiment of the present invention, all the switches can be zero-voltage-switched. Without adding the external inductor LEXT, leakage inductance may be used. The leakage inductance may be leakage inductance of a transformer electrically connected to the piezoelectric circuit and the piezoelectric driving circuit.

Another embodiment of the present invention employing the piezoelectric circuit 12 will be described with reference to FIG. 7.

Figure 7:
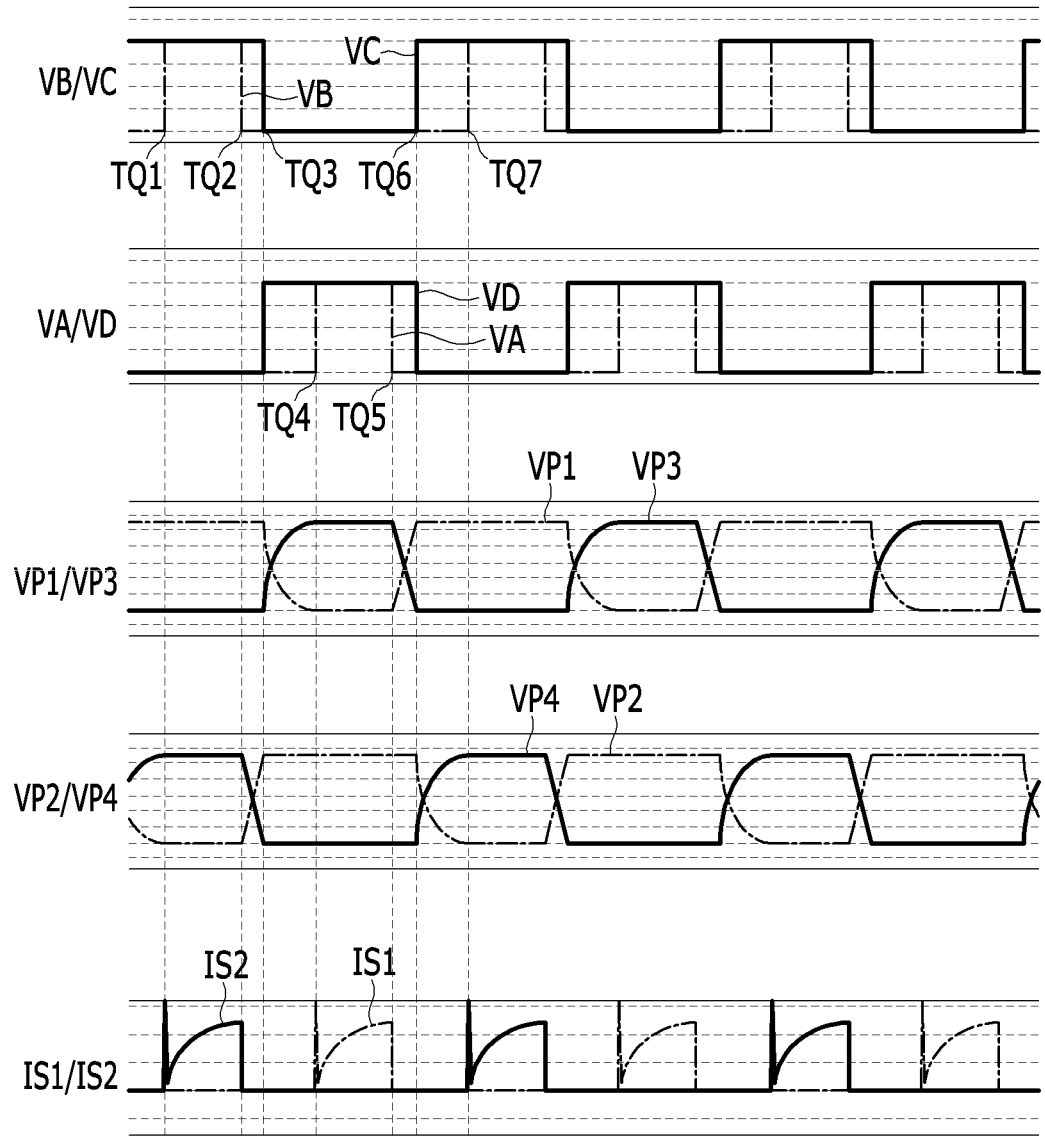
FIG. 7 is a waveform view illustrating a control voltage of the piezoelectric driving circuit, switch currents, and both-end voltages of switches according to another embodiment of the present invention.

FIG. 7 is a waveform view illustrating a control voltage of the piezoelectric driving circuit, switch currents, and both end voltages of switches according to another embodiment of the present invention. Both-end voltages of the switches illustrated in FIG. 7 are voltage waveforms under a condition that ZVS is satisfied.

A sine wave of the voltage VP2 becomes a zero voltage at TQ11, and a second control voltage VB has a high level at TQ11 according to a fire angle of the second switch S2 set according to TQ11, to turn on the second switch S2 (ZVS). At TQ12 at which a pre-set duty cycle has lapsed, the second control voltage VB has a low level and the second switch S2 is turned off.

At TQ11, the third control voltage VC has a high level and the third switch S3 is in an ON state, so the voltage VDC is connected to the piezoelectric circuit 12 during the period TQ11 to TQ12, and a peak is generated in the second switch current IS2 at TQ11. During the period TQ11 to TQ12, the second switch current IS2 is increased. The peak illustrated in FIG. 7 is smaller than the peak of the second switch current IS2 illustrated in FIG. 2. In actuality, when a perfect ZVS operation is performed, a peak current substantially disappears. Here, it is described that a peak is present in spite of a perfect ZVS operation, for the description purpose.

After the second switch S2 is turned off at TQ12, the capacitor C4 is discharged by the inductor current IEXT to reduce the fourth switch voltage VP4. At a timing at which the fourth switching voltage VP4, which has been reduced starting from TQ12, reaches a zero voltage, or at a slightly later TQ13, the fourth voltage VD has a high level and the fourth switch S4 is turned on.

At TQ13, the third control voltage VC has a low level and the third switch S3 is turned off. From a timing at which the third switch S3 is turned off, the capacitor C1 starts to be discharged and the capacitor C3 is charged, so the first switch voltage VP1 starts to be reduced from TQ13 and the third switch voltage VP3 starts to be increased.

The first switch voltage VP1, which has been reduced by a sine wave, reaches a zero voltage at TQ14. The first control voltage VA has a high level at TQ14 according to a fire angle of the first switch S1 set according to TQ14, to turn on the switch S1 (ZVS). And then, at TQ15 at which the pre-set duty cycle has lapsed, the first control voltage VA has a low level and the first switch S1 is turned off.

Since the fourth switch S4 is in an ON state at TQ14, the voltage VDC is connected to the piezoelectric circuit 12 during the period TQ14 to TQ15, and a peak is generated in the first switch current IS1 at TQ14. A peak of the first switch current IS1 generated at TQ14 is smaller than the peak at TQ4 illustrated in FIG. 2.

After the first control voltage has a low level and the first switch S1 is turned off at TQ15, the capacitor C3 is discharged to reduce the third switch VP3. At a timing at which the third switch voltage VP3, which has been reduced, reaches a zero voltage or at a slightly later TQ16, the third switch S3 is turned on. The capacitor C1 is starts to be charged from TQ15 to increase the first switch voltage VP1.

At TQ16, the third switch voltage VP3 is reduced to a zero voltage, so at TQ16, the third control voltage VC has a high level and the third switch S3 is turned on. At TQ6, the fourth control voltage VD has a low level and the fourth switch S4 is turned off.

At TQ16, the capacitor C2 starts to be discharged to reduce the second switch voltage VP2, and the capacitor C4 starts to be charged to increase the fourth switch voltage VP4.

The second switch voltage VP2, which has been reduced by a sine wave, reaches a zero voltage at TQ7. Then, the second control voltage VB has a high level to turn on the second switch S2 (ZVS).

Thereafter, the operations from TQ11 to TQ17 are repeatedly performed, so a detailed description thereof will be omitted.

In this manner, when the fire angle and the duty cycle are set according to the flow chart described above with reference to FIGS. 3 and 5, ZVS, or at least QZVS, is implemented.

In the embodiment of the present invention, it has been described that the fire angle and the duty cycle of the upper switches S1 and S2 are set based on the lower switches S3 and S4, but the embodiment of the present invention is not limited thereto.

In detail, in a state in which the duty cycle of the upper switches S1 and S2 is set as 50%, a fire angle and a duty cycle of the lower switches (S4 corresponding to S1 and S3 corresponding to S2) corresponding to the upper switches S1 and S2 may be set according to the flow chart described above with reference to FIGS. 3 and 5. Then, ZVS, or at least QZVS, is implemented.

In the case of the piezoelectric driving circuit according to embodiments of the present invention, switching loss can be significantly reduced by reducing a peak current through soft switching, providing an effect of reducing input power in comparison to the related art piezoelectric driving circuit. Namely, all the switches of the driving circuit are zero-voltage-switched (ZVS) or the upper switches are at least quasi-zero-voltage-switched (QZVS) while the other remaining two switches are zero-voltage-switched (ZVS) to reduce switching loss, thus reducing power consumption.

In detail, a voltage for determining mechanical energy, e.g., vibration, of the piezoelectric circuit is a both-end voltage of the capacitor CA. In comparison to input power required for obtaining a required amount of both-end voltage of the capacitor CA, input power according to an embodiment of the present invention is smaller. Thus, in comparison to the related art piezoelectric circuit, electrical energy required for obtaining the same level of mechanical energy is smaller.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS piezoelectric circuit 10 and 12, the first inductor (L)
external inductor (LEXT), the first capacitor (CA)
the second capacitor (CB), resistor (R), piezoelectric driving circuit 20,
body diode (BD1-BD4), parasitic capacitor (C1-C4)
the first switch to the fourth switch (S1-S4), series resonance circuit 11

What is claimed is:

1. A piezoelectric driving comprising:
providing a piezoelectric circuit comprising a first driving switch connected to one end of the circuit, a second driving switch corresponding to the first driving switch and connected to the other end of the circuit and a sensing resistor configured to sense a current flowing in the circuit;
turning on the first driving switch in a state in which the second driving switch is in a turned-on state; and
adjusting a fire angle and a duty cycle of the first driving switch for reducing a peak of a sense voltage generated in the sensing resistor at a turn-on timing occurring when the first driving switch is turned on.

2. The method of claim 1, wherein the adjusting of a fire angle and a duty cycle comprises:

setting the fire angle and a duty cycle of the first driving switch at the time when the peak of the sense voltage is reduced to a voltage lower than a predetermined reference voltage at the timing at which the first driving switch is turned on, wherein the predetermined reference voltage is determined based on a peak of an allowable piezoelectric circuit current.

3. The method of claim 2, wherein the adjusting of a fire angle and a duty cycle comprises storing the currently held voltage as the immediately previous held voltage and increasing the fire angle in a first operation occurring when the peak of the sense voltage at the turn-on timing of the first driving switch is equal to or higher than the reference voltage and a currently held voltage as a peak of the sense voltage at the turn-on timing is lower than an immediately previous held voltage as a peak of the sense voltage at an immediately previous turn-on timing of the first driving switch.

4. The method of claim 3, wherein the first operation is repeatedly performed, when the currently held voltage as a peak of the sense voltage is equal to or higher than the reference voltage.

5. The method of claim 2, wherein the adjusting of a fire angle and a duty cycle comprises reducing the first angle and increasing the duty cycle in a second operation occurring when the peak of the sense voltage at the turn-on timing of the first driving switch is equal to or higher than the reference voltage and a currently held voltage as a peak of the sense voltage at the turn-on timing is equal to or higher than an immediately previous held voltage as a peak of the sense voltage at an immediately previous turn-on timing of the first driving switch.

6. The method of claim 5, wherein the adjusting of a fire angle and a duty cycle comprises:
storing the currently held voltage as the immediately previous held voltage and comparing the currently held voltage at the turn-on timing of the first driving switch with the reference voltage, the currently held voltage being based on the reduced fire angle and increased duty cycle.

7. The method of claim 6, wherein the adjusting of a fire angle and a duty cycle further comprises storing the currently held voltage as the immediately previous held voltage and increasing the fire angle in a third operation occurring when the currently held voltage is equal to or higher than the reference voltage and lower than the immediately previous held voltage based on the comparison results.

8. The method of claim 7, wherein the adjusting of a fire angle and a duty cycle comprises:
comparing the currently held voltage and the immediately previous held voltage with one another; and
repeatedly performing the second operation or the third operation based on the results of the comparison when the currently held voltage at the turn-on timing of the first driving switch is equal to or higher than the reference voltage based on the increased fire angle.

9. The method of claim 6, wherein the adjusting of a fire angle and a duty cycle further comprises increasing the duty cycle, storing the currently held voltage as the immediately previous held voltage and comparing the currently held voltage at the turn-on timing of the first driving switch with the reference voltage, the currently held voltage being based on the increased duty cycle, in a fourth operation occurring when the currently held voltage is equal to or higher than the reference voltage and equal to or higher than the immediately previous voltage based on the comparison results.

10. The method of claim 9, wherein the fourth operation is repeatedly performed, when the currently held voltage is equal to or higher than the reference voltage and equal to or higher than the immediately previous held voltage in the fourth operation.

11. The method of claim 6, wherein the adjusting of a fire angle and a duty cycle further comprises storing the currently held voltage as the immediately previous held voltage and reducing the fire angle when the currently held voltage is equal to or higher than the reference voltage and lower than the immediately previous held voltage.

12. The method of claim 11, wherein the adjusting of a fire angle and a duty cycle further comprises:
detecting and holding a peak of the sense voltage at the turn-on timing of the first driving switch based on the reduced fire angle for generating a currently held voltage;
comparing the currently held voltage with the reference voltage; and
comparing the currently held voltage with the immediately previous held voltage when the currently held voltage is equal to or higher than the reference voltage.

13. The method of claim 12, wherein, when the currently held voltage is equal to or higher than the reference voltage and lower than the immediately previous held voltage, the adjusting of a fire angle and a duty cycle further comprises:
reducing the fire angle again;
detecting and holding a peak of the sense voltage at the turn-on timing of the first driving switch based on the reduced fire angle for generating a currently held voltage;
comparing the currently held voltage with the reference voltage; and
comparing the currently held voltage with the immediately previous held voltage when the currently held voltage is equal to or higher than the reference voltage.

14. The method of claim 12, wherein the adjusting of a fire angle and a duty cycle further comprises increasing the fire angle and the duty cycle and storing the currently held voltage as the immediately previous held voltage when the currently held voltage is equal to or higher than the reference voltage and is equal to or higher than the immediately previous held voltage.

15. The method of claim 14, wherein the adjusting of a fire angle and a duty cycle further comprises comparing the currently held voltage and the immediately previous held voltage when the currently held voltage at the turn-on timing of the first driving switch based on the increased fire angle and the increased duty cycle is equal to or higher than the reference voltage.

16. The method of claim 15, wherein the adjusting of a fire angle and a duty cycle further comprises storing the currently held voltage as the immediately previous held voltage and increasing the fire angle when the currently held voltage is lower than the immediately previous held voltage.

17. The method of claim 16, wherein the adjusting of a fire angle and a duty cycle further comprises increasing the duty cycle again and storing the currently held voltage as the immediately previous held voltage when the currently held voltage is equal to or higher than the immediately previous held voltage.

18. The method of claim 17, wherein, when the currently held voltage at the turn-on timing of the first driving switch according to the increased duty cycle is equal to or higher than the reference voltage, the adjusting of a fire angle and a duty cycle further comprises:

comparing the currently held voltage and the immediately previous held voltage; and storing the currently held voltage as the immediately previous held voltage and increasing the fire angle when the currently held voltage is lower than the immediately previous held voltage based on the comparison result.

19. The method of claim 17, wherein, when the currently held voltage at the turn-on timing of the first driving switch according to the increased duty cycle is equal to or higher than the reference voltage, the adjusting of a fire angle and a duty cycle further comprises:

comparing the currently held voltage and the immediately previous held voltage; and increasing the duty cycle again and storing the currently held voltage as the immediately previous held voltage when the currently held voltage is equal to or higher than the immediately previous held voltage based on the comparison result.

20. A driving circuit of a piezoelectric circuit connected between a first node and a second node, the driving circuit comprising:

a full-bridge circuit comprising a first switch and a third switch coupled to at least the first node and a second switch and a fourth switch coupled to at least the second node; and a sensing resistor coupled between the full-bridge circuit and a predetermined voltage and configured to sense a current flowing to the piezoelectric circuit, wherein at least one of the first switch and the second switch of the driving circuit is configured to be a first driving switch and at least one of the third switch and the fourth switch is configured to be a second driving switch, wherein the first driving switch is configured to be turned on when the second driving switch is in a turned-on state and a fire angle and a duty cycle of the first driving switch is configured to be adjusted for reducing a peak of a sense voltage generated in the sensing resistor when the first driving switch is turned on, wherein, when the first switch is the first driving switch, the fourth switch is the second driving switch, and wherein, when the second switch is the first driving switch, the third switch is the second driving switch.

21. The driving circuit of claim 20, wherein the piezoelectric circuit further comprises an external inductor coupled between the first node and the second node.

* * * * *